(12) United States Patent
Yamaoka

(10) Patent No.: US 12,432,850 B2
(45) Date of Patent: Sep. 30, 2025

(54) LIGHT-EMITTING MODULE WITH SPACER

(71) Applicant: NICHIA CORPORATION, Anan (JP)

(72) Inventor: Kensuke Yamaoka, Tokushima (JP)

(73) Assignee: NICHIA CORPORATION, Anan (JP)

( * ) Notice: Subject to any disclaimer, the term of this patent is extended or adjusted under 35 U.S.C. 154(b) by 243 days.

(21) Appl. No.: 18/339,983

(22) Filed: Jun. 22, 2023

(65) Prior Publication Data
US 2023/0422395 A1 Dec. 28, 2023

(30) Foreign Application Priority Data

Jun. 24, 2022 (JP) ................... 2022-102116

(51) Int. Cl.
H05K 1/02 (2006.01)
H01L 25/075 (2006.01)
H01L 25/16 (2023.01)
H05K 1/14 (2006.01)

(52) U.S. Cl.
CPC ....... H05K 1/0274 (2013.01); H01L 25/0753 (2013.01); H01L 25/167 (2013.01); H05K 1/144 (2013.01); H05K 2201/10121 (2013.01); H05K 2201/2036 (2013.01); H05K 2201/2054 (2013.01)

(58) Field of Classification Search
CPC .............. H05K 1/0274; H05K 1/144; H05K 2201/2054; H05K 2201/2036; H05K 2201/10121; H01L 25/0753; H01L 25/167
See application file for complete search history.

(56) References Cited

U.S. PATENT DOCUMENTS

2007/0075306 A1* 4/2007 Hayashi ............. H10H 20/8581
257/E33.073
2008/0203420 A1 8/2008 Higaki et al.
2009/0053850 A1 2/2009 Nishida et al.
(Continued)

FOREIGN PATENT DOCUMENTS

JP H08236739 A 9/1996
JP 2004-335740 A 11/2004
(Continued)

OTHER PUBLICATIONS

Kurimoto et al., Light Source Module and Electronic Device Provided With Module, 2010, JP-4604123-B2, https://worldwide.espacenet.com/patent/search/family/042827812/publication/JP4604123B2?q=pn%3DJP4604123B2 (Year: 2010).*
(Continued)

Primary Examiner — James R Greece
Assistant Examiner — Michael Chiang
(74) Attorney, Agent, or Firm — Global IP Counselors, LLP

(57) ABSTRACT

A light-emitting module includes a first wiring board, a plurality of light-emitting elements disposed on or above the first wiring board, a first light-transmissive layer covering the plurality of light-emitting elements, a spacer disposed on or above the first light-transmissive layer, and a second light-transmissive layer disposed on or above the spacer. An air layer is present between the first light-transmissive layer and the second light-transmissive layer. The spacer does not overlap with at least one of the plurality of light-emitting elements in a plan view.

19 Claims, 9 Drawing Sheets

(56) References Cited

U.S. PATENT DOCUMENTS

| | | | | |
|---|---|---|---|---|
| 2009/0322197 | A1* | 12/2009 | Helbing | H10H 20/8583 313/46 |
| 2010/0328925 | A1* | 12/2010 | Hoelen | F21K 9/64 362/84 |
| 2011/0025192 | A1* | 2/2011 | Ansems | F21V 9/38 313/501 |
| 2015/0338065 | A1* | 11/2015 | Wang | G02F 1/133609 362/97.1 |
| 2015/0376344 | A1* | 12/2015 | Dent | C08K 5/56 252/301.36 |
| 2017/0084803 | A1 | 3/2017 | Iwaki | |
| 2018/0315901 | A1* | 11/2018 | Lopez | H10H 20/8514 |

FOREIGN PATENT DOCUMENTS

| | | | |
|---|---|---|---|
| JP | 2006-303482 A | | 11/2006 |
| JP | 2007116138 A | | 5/2007 |
| JP | 2008-047665 A | | 2/2008 |
| JP | 4604123 B2 * | 10/2010 | H01L 33/58 |
| JP | 2010238837 A | | 10/2010 |
| JP | 2011-054829 A | | 3/2011 |
| JP | 2011517108 A | | 5/2011 |
| JP | 2013-156556 A | | 8/2013 |
| JP | 2014-075480 A | | 4/2014 |
| JP | 2016127145 A * | 7/2016 | |
| JP | 2017-059818 A | | 3/2017 |
| JP | 2017-212301 A | | 11/2017 |
| JP | 2018049185 A * | 3/2018 | |
| JP | 2018-531517 A | | 10/2018 |
| JP | 2019-207956 A | | 12/2019 |
| JP | 2019-216178 A | | 12/2019 |
| JP | 2020-021904 A | | 2/2020 |
| WO | 2006013731 A1 | | 2/2006 |

OTHER PUBLICATIONS

Asano et al., Wavelength Conversion Member and Light-Emitting Device, 2018, JP-2018049185-A, https://worldwide.espacenet.com/patent/search/family/061767521/publication/JP2018049185A?q=pn%3DJP2018049185A (Year: 2018).*

Hara et al., Light Emitting Device and Projection Device, 2016, JP-2016127145-A, https://worldwide.espacenet.com/patent/search/family/056359646/publication/JP2016127145A?q=pn%3DJP2016127145A (Year: 2016).*

* cited by examiner

LIGHT-EMITTING MODULE WITH SPACER

CROSS-REFERENCE TO RELATED APPLICATION

This application claims priority to Japanese Patent Application No. 2022-102116 filed on Jun. 24, 2022, the disclosure of which is hereby incorporated herein by reference in its entirety.

BACKGROUND

The present disclosure relates to a light-emitting module.

Light-emitting modules each including a plurality of light-emitting elements have been used as light sources for vehicles or light sources for projectors in recent years. Known examples of such a light-emitting module include a structure in which a plurality of light-emitting elements are arranged on a submount, and the submount is mounted on a wiring board (see, for example, Japanese Unexamined Patent Application Publication No. 2017-212301).

SUMMARY

An object of certain embodiments of the present invention is to provide a light-emitting module whose luminance can be improved.

A light-emitting module according to an embodiment of the present invention includes a first wiring board, a plurality of light-emitting elements disposed on or above the first wiring board, a first light-transmissive layer covering the plurality of light-emitting elements, a spacer disposed on or above the first light-transmissive layer, and a second light-transmissive layer disposed on or above the spacer. An air layer is present between the first light-transmissive layer and the second light-transmissive layer. The spacer does not overlap with at least one of the plurality of light-emitting elements in a plan view.

According to certain embodiments of the present invention, a light-emitting module can be provided whose luminance can be improved.

DETAILED DESCRIPTION OF EMBODIMENTS

Figure 1:
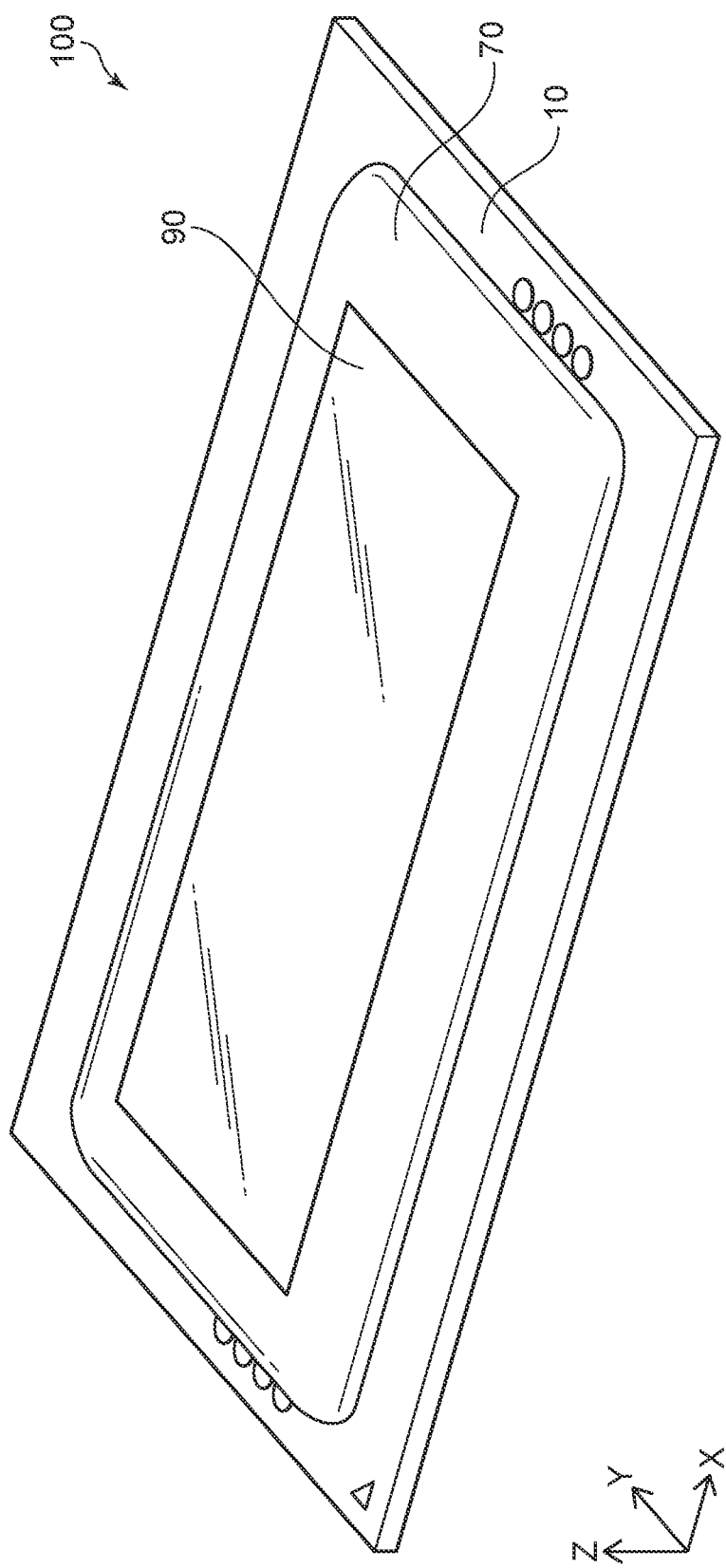
FIG. 1 is a schematic perspective view of a light-emitting module according to a first embodiment as viewed from obliquely above.

The following describes embodiments of the present invention referring to the accompanying drawings. Each drawing is schematic, and emphasis or simplification is given as appropriate. For example, light-emitting elements in some drawings are depicted as larger than the actual size relative to a light-emitting module. Dimension ratios between components may be inconsistent between drawings. The illustration of components may be partly omitted to prevent the drawings from being excessively complicated, and end views showing only cross sections of members may be used as cross-sectional views.

First Embodiment

A light-emitting module 1 according to a first embodiment has a rectangular shape in a plan view and includes a first wiring board 20, a plurality of light-emitting elements 30 disposed on or above the first wiring board 20, a first light-transmissive layer 50 covering the plurality of light-emitting elements 30, a spacer 80 disposed on or above the first light-transmissive layer 50, and a second light-transmissive layer 90 disposed on or above the spacer 80. An air layer 100 is present between the first light-transmissive layer 50 and the second light-transmissive layer 90. The spacer 80 does not overlap with at least one light-emitting element 30 among the plurality of light-emitting elements 30 in a plan view.

FIG. 1 is a schematic perspective view of the light-emitting module according to the present embodiment as viewed from obliquely above.

Figure 2:
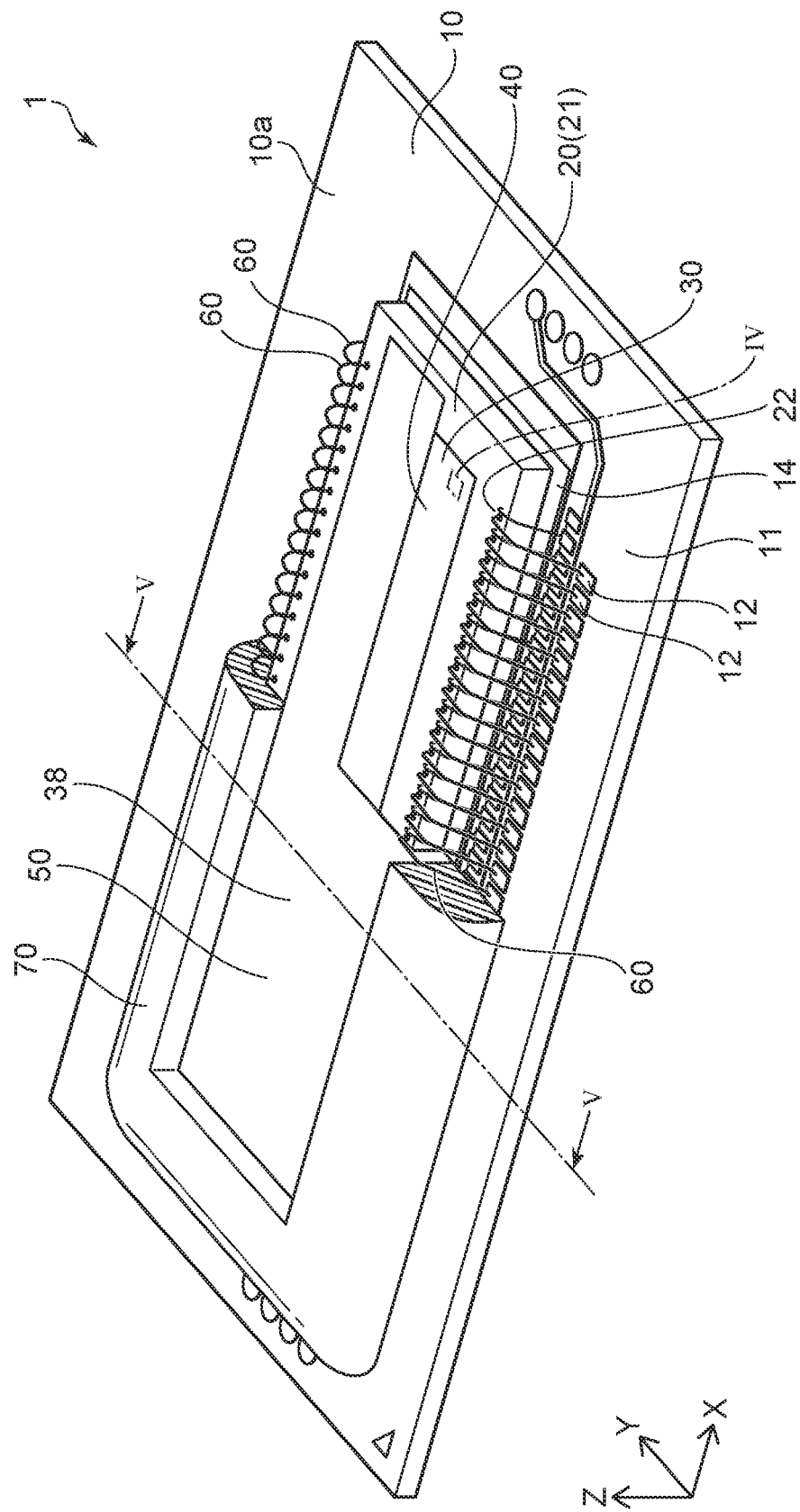
FIG. 2 is a schematic perspective view of the light-emitting module according to the first embodiment with a portion of the structure being omitted as viewed from obliquely above.

FIG. 2 is a schematic perspective view of the light-emitting module according to the present embodiment with a portion of the structure being omitted as viewed from obliquely above.

Figure 3:
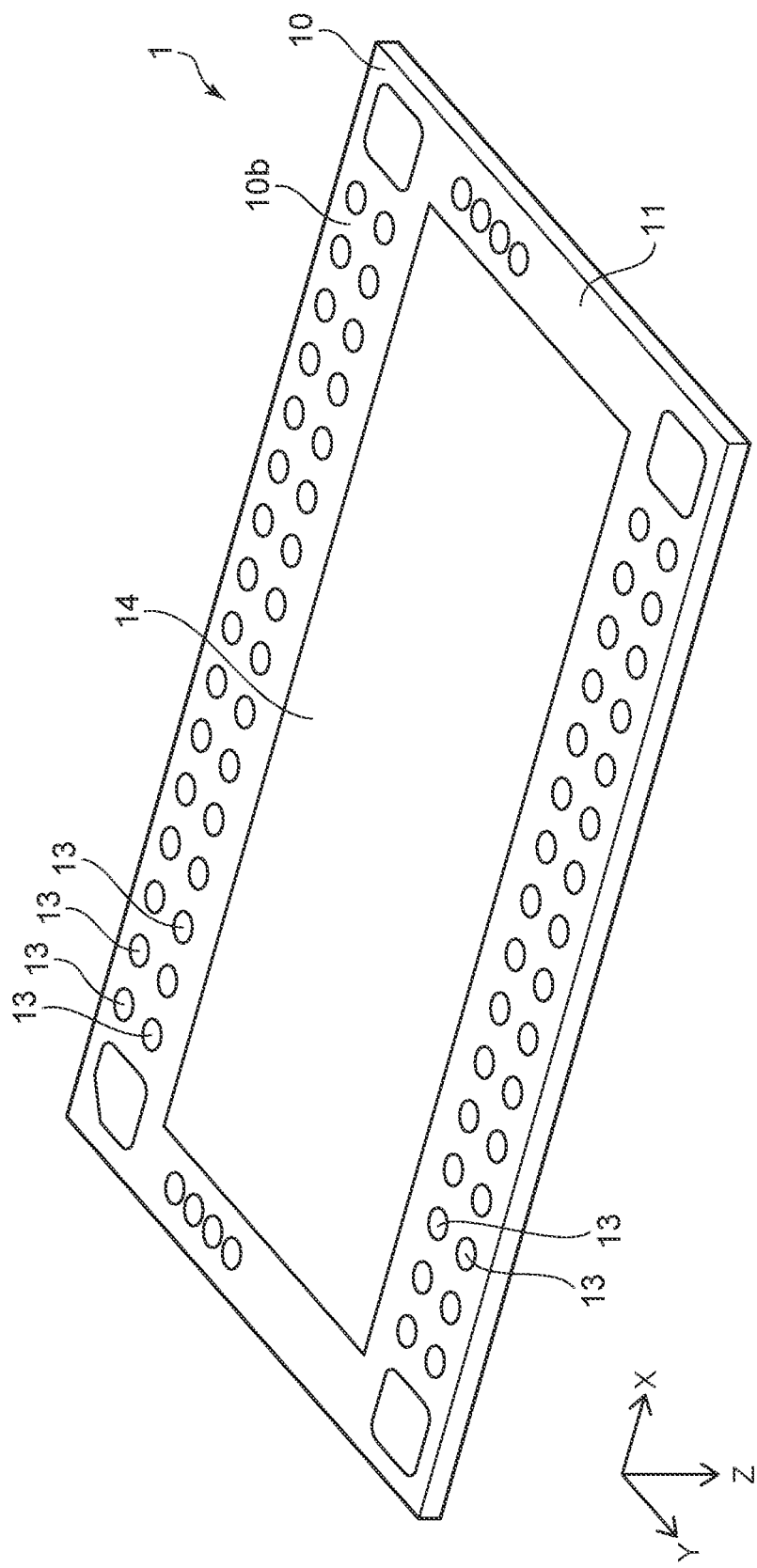
FIG. 3 is a schematic perspective view of the light-emitting module according to the first embodiment as viewed from obliquely below.

FIG. 3 is a schematic perspective view of the light-emitting module according to the present embodiment as viewed from obliquely below.

Figure 4:
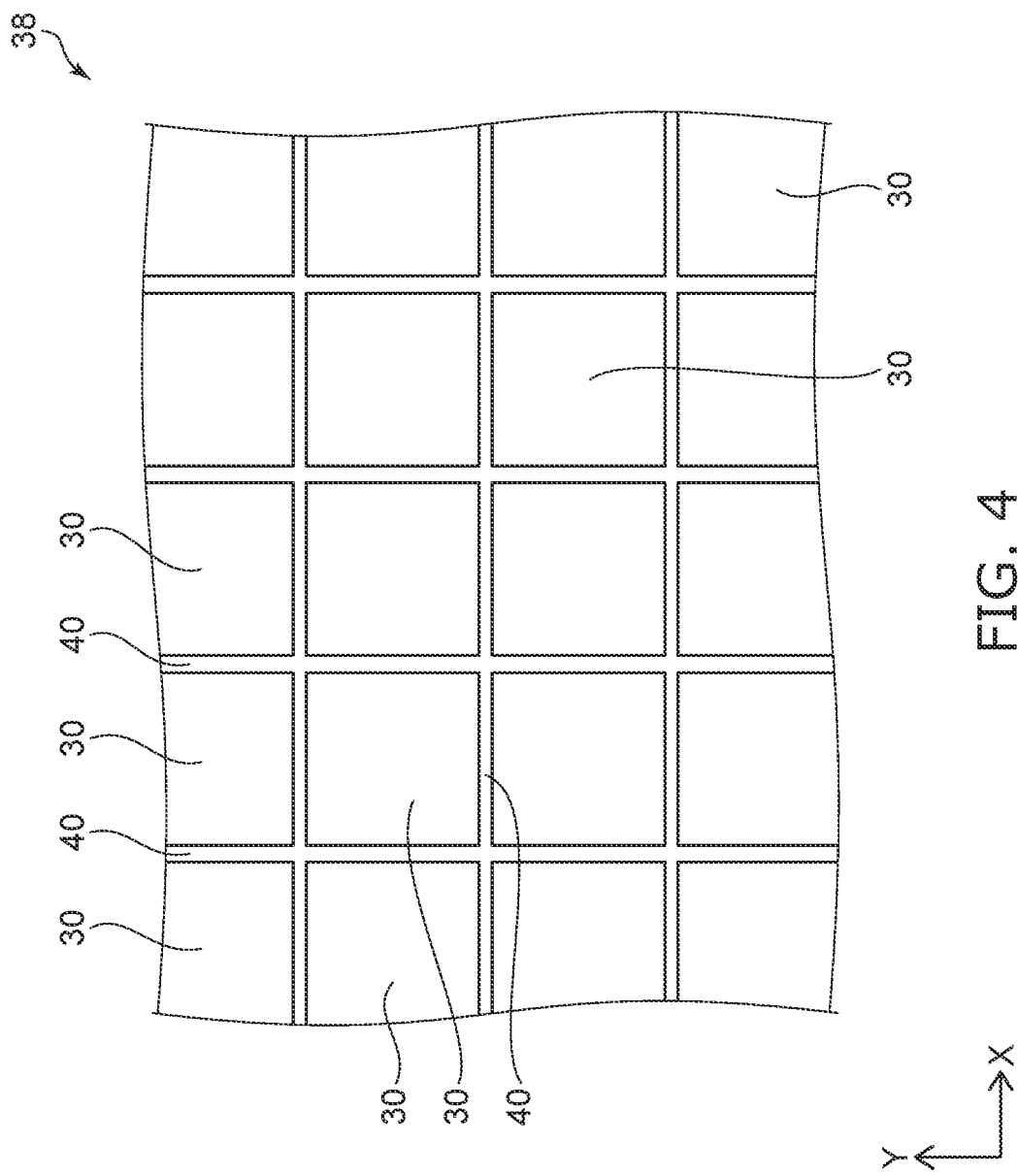
FIG. 4 is a schematic enlarged plan view of a region IV in FIG. 2.

FIG. 4 is a schematic enlarged plan view of a region IV in FIG. 2.

Figure 5:
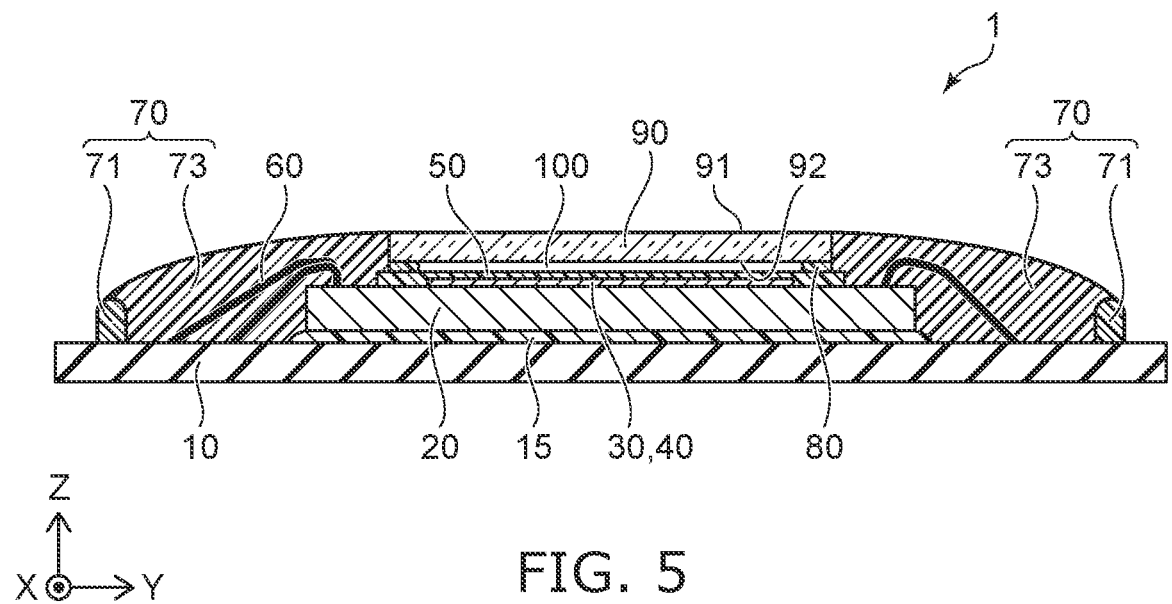
FIG. 5 is a schematic cross-sectional view taken along the line V-V of FIG. 2.

FIG. 5 is a schematic cross-sectional view taken along the line V-V of FIG. 2.

Figure 6:
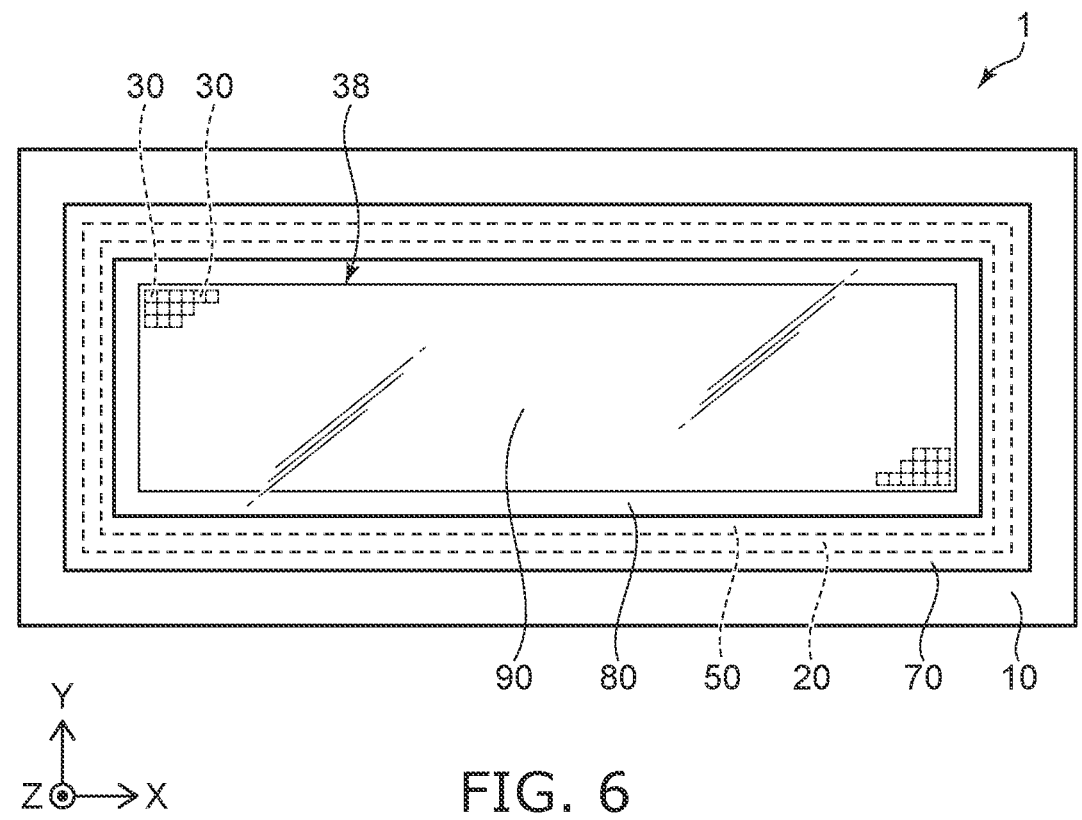
FIG. 6 is a schematic top view of the light-emitting module according to the first embodiment.

FIG. 6 is a schematic top view of the light-emitting module according to the present embodiment.

Figure 7:
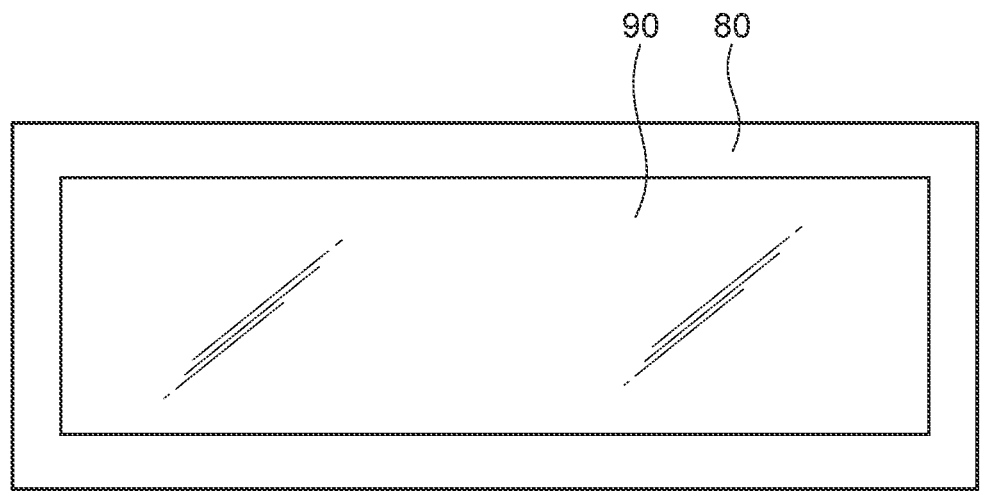
FIG. 7 is a schematic bottom view of a second light-transmissive layer and a spacer in the first embodiment.

FIG. 7 is a schematic bottom view of the second light-transmissive layer and the spacer in the present embodiment.

Figure 8:
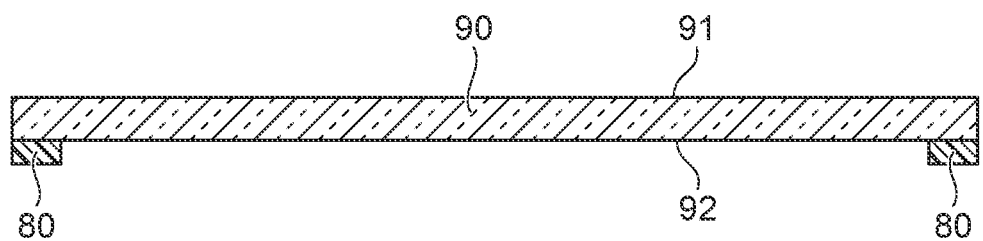
FIG. 8 is a schematic cross-sectional view of the second light-transmissive layer and the spacer in the first embodiment.

FIG. 8 is a schematic cross-sectional view of the second light-transmissive layer and the spacer in the present embodiment.

Illustrations of the second light-transmissive layer and the spacer are omitted in FIG. 2 and FIG. 4.

An XYZ orthogonal coordinate system is employed for the convenience of description in the present specification. A direction from the first wiring board 20 to the second light-transmissive layer 90 is referred to as a "Z direction." The longitudinal direction of the light-emitting module 1 is referred to as an "X direction," and the short direction is referred to as a "Y direction." The Z direction is also referred to as an "upward" direction, and the direction opposite to the Z direction is also referred to as a "downward" direction. These terms are also used for convenience and are irrelevant to the direction of gravity. The term "plan view" as used in the present specification refers to the case of viewing in the Z direction.

The light-emitting module 1 of the present embodiment includes the first wiring board 20, a second wiring board 10, the light-emitting elements 30, a second resin 40, the first light-transmissive layer 50, a plurality of wires 60, a first resin 70, the spacer 80, and the second light-transmissive layer 90 as shown in FIG. 1 to FIG. 5. In FIG. 2, illustration of the entirety of the second light-transmissive layer 90, the entirety of the spacer 80, a portion of the first resin 70, and a portion of the first light-transmissive layer 50 are omitted, and some of the wires 60, some of the light-emitting elements 30, and the like are shown for convenience of illustration.

For example, the first wiring board 20 is a silicon substrate containing an integrated circuit and is, for example, an application-specific integrated circuit board (ASIC board). A lower surface of the first wiring board 20 is bonded to an upper surface of the second wiring board 10 described below with a bonding member 15 therebetween. Silver paste, sintered silver, solder, or the like can be used as the bonding member 15. For example, the bonding member 15 is silver paste containing a silicone resin. The first wiring board 20 has a rectangular shape in a plan view. A central portion of an upper surface 21 of the first wiring board 20 serves as a region on which the light-emitting elements 30 are mounted. Upper surface pads connected to the light-emitting elements 30 are disposed in this region, and first terminals 22 electrically connected to the upper surface pads are disposed around this region.

For example, the second wiring board 10 has a rectangular shape in a plan view and includes a flat plate-shaped base member 11 and wiring disposed at least on an upper surface of the base member 11. The second wiring board 10 may be flat plate-shaped or may have a recess in the upper surface to accommodate the first wiring board 20. As a material of the base member 11, a material that gives high heat dissipation performance is preferably used, and a material that exhibits high light-shielding performance and strength is more preferable. Specific examples of the material of the base member 11 include a metal such as aluminum (Al) and copper (Cu), a ceramic such as aluminum oxide, aluminum nitride, silicon nitride, and mullite, a resin such as a phenolic resin, an epoxy resin, a polyimide resin, a bismaleimide-triazine resin (BT resin), and polyphthalamide (PPA), and a composite material constituted of a resin and a metal or a ceramic. Examples of a material of the wiring include a metal such as copper (Cu), silver (Ag), gold (Au), aluminum (Al), platinum (Pt), titanium (Ti), tungsten (W), palladium (Pd), iron (Fe), and nickel (Ni) and an alloy of these metals.

In an example, the second wiring board 10 is a layered board of a metal member made of aluminum (Al), copper (Cu), or the like constituting the wiring and an insulating member made of an epoxy resin or the like constituting the base member 11. The wiring is disposed on a surface and inside of the second wiring board 10. A portion of the wiring constitutes a plurality of second terminals 12 on an upper surface 10a of the second wiring board 10, and another portion of the wiring constitutes a plurality of lower surface pads 13 on a lower surface 10b of the second wiring board 10.

On the upper surface 10a and the lower surface 10b of the second wiring board 10, the metal member is exposed from the insulating member to constitute a heat dissipation portion 14. The heat dissipation portion 14 is located on the central portion of the second wiring board 10, and a plurality of second terminals 12 and a plurality of lower surface pads 13 are disposed on each of both sides of the heat dissipation portion 14 in a plan view. The first wiring board 20 is disposed on the heat dissipation portion 14 of the upper surface 10a of the second wiring board 10. For example, the second terminals 12 and the lower surface pads 13 are disposed along the long sides of the second wiring board 10.

The wires 60 are members electrically connecting the second wiring board 10 to the first wiring board 20. Each of the wires 60 is connected to a corresponding one of the second terminals 12 of the second wiring board 10 and a corresponding one of the first terminals 22 of the first wiring board 20. Examples of the material of the wires 60 include gold (Au). For example, the number of the wires 60 is equal to the number of the second terminals 12. The wires 60 are disposed in rows along the outer edges of the first wiring board 20 and connected to the second wiring board 10 astride the outer edges of the first wiring board 20.

The light-emitting elements 30 are mounted on the central portion of the upper surface 21 of the first wiring board 20. The light-emitting elements 30 have a substantially rectangular shape in a plan view. For example, the light-emitting elements 30 are arranged in a matrix. In one example, a total of 16,384 light-emitting elements 30 having substantially square upper surfaces are arranged in 64 rows and 256 columns. In one example, the arrangement pitch (for example, the distance between the centers of light-emitting elements 30 adjacent in the X direction and/or the Y direction) of the light-emitting elements 30 is in a range of 45 μm to 55 μm, and the length of a side of each light-emitting element 30 is in a range of 40 μm to 50 μm. The distance between adjacent light-emitting elements 30 is therefore in a range of 5 μm to 15 μm. In one example, the thickness of the light-emitting elements 30 is in a range of 5 μm to 10 μm. The light-emitting elements 30 are connected to the upper surface pads of the upper surface 21 of the first wiring board 20. The light-emitting elements 30 are, for example, light-emitting diodes (LEDs) and emit, for example, blue light.

Elements that emit light with any appropriate wavelength can be selected for the light-emitting elements 30. For example, as light-emitting elements that emit blue or green light, light-emitting elements using ZnSe, a nitride semiconductor ($In_xAl_yGa_{1-x-y}N$, $0 \leq x$, $0 \leq y$, and $x+y<1$), or GaP can be selected. For light-emitting elements 30 that emit red light, semiconductors represented by GaAlAs or AlInGaP can be preferably used. Alternatively, semiconductor light-emitting elements made of materials other than the above materials may be used. The composition and emission color of the light-emitting elements 30 can be appropriately selected according to the purpose.

The second resin 40 is light-reflective. The second resin 40 is disposed between adjacent light-emitting elements 30. The second resin 40 may be further disposed between the upper surface 21 of the first wiring board 20 and the lower surfaces of the light-emitting elements 30. That is, the second resin 40 may cover the lateral surfaces and the lower surfaces of the light-emitting elements 30 with the upper surfaces of the light-emitting elements 30 exposed from the second resin 40. The second resin 40 may cover the entirety of the lateral surfaces of the light-emitting elements 30. The second resin 40 may be disposed with an upper portion of the lateral surfaces of the light-emitting elements 30 from the second resin 40, the lateral surfaces being continuous with the upper surface 21. Covering the lateral surfaces of the light-emitting elements 30 with the light-reflective second resin 40 allows a larger portion of light emitted from the light-emitting elements 30 to be extracted from the upper surface 21. The second resin 40 contains a base material made of a light-transmissive resin and a light-reflective substance contained in the base material. The light extraction efficiency from the light-emitting elements 30 can be enhanced by increasing the content of the light-reflective substance in the second resin 40. The concentration of the light-reflective substance in the second resin 40 is preferably 50 mass % or more and 70 mass % or less, such as about 60 mass %, from the viewpoint of improvement of the light extraction efficiency and the viewpoint of the fluidity of the resin.

Examples of the light-transmissive resin constituting the base material of the second resin 40 include resins such as a silicone resin, a modified silicone resin, an epoxy resin, a modified epoxy resin, an acrylic resin, and a hybrid resin containing at least one of these resins. Among these resins, a silicone resin, which has good resistance to heat and light, is preferably used, and a dimethyl silicone resin is more preferably used. A dimethyl silicone resin has better reliability such as high temperature resistance and thus can be preferably used for materials for vehicles. Preferable examples of the light-reflective substance include titanium oxide, aluminum oxide, zinc oxide, barium carbonate, barium sulfate, boron nitride, aluminum nitride, and glass filler. In an example, the base material is a dimethyl silicone resin, and the light-reflective substance is titanium oxide. For example, the external color of the second resin 40 is white.

The first light-transmissive layer 50 is light-transmissive and covers the upper surfaces of the light-emitting elements 30 and the upper surface of the second resin 40. The first light-transmissive layer 50 is in contact with the upper surfaces of the light-emitting elements 30, the upper portions of the lateral surfaces of the light-emitting elements 30, and the upper surface of the second resin 40. The first light-transmissive layer 50 is in contact with the upper surface of the first wiring board 20 in a region not provided with the light-emitting elements 30 or the second resin 40. The first light-transmissive layer 50 contains at least a base material constituted of a light-transmissive resin and may contain a phosphor in the base material. In one example, a thickness (that is, the distance between an upper surface of a light-emitting element 30 and the upper surface of the first light-transmissive layer 50) of the first light-transmissive layer 50 covering the light-emitting elements 30 is in a range of 25 μm to 35 μm. A portion of the upper surface of the first light-transmissive layer 50 located directly above a plurality of light-emitting elements 30 constitutes an emission surface 38 of the light-emitting module 1.

The base material of the first light-transmissive layer 50 can be the same as the base material of the second resin 40 described above. Examples of the phosphor include yttrium-aluminum-garnet based phosphors (such as $(Y,Gd)_3(Al,Ga)_5O_{12}$:Ce), lutetium-aluminum-garnet based phosphors (such as $Lu_3(Al,Ga)_5O_{12}$:Ce), terbium-aluminum-garnet based phosphors (such as $Tb_3(Al,Ga)_5O_{12}$:Ce), CCA based phosphors (such as $Ca_{10}(PO_4)_6C_{12}$:Eu), SAE based phosphors (such as $Sr_4Al_{14}O_{25}$:Eu), chlorosilicate based phosphors (such as $Ca_8MgSi_4O_{16}C_{12}$:Eu), silicate based phosphors (such as $(Ba,Sr,Ca,Mg)_2SiO_4$:Eu), oxynitride based phosphors such as β-SiAlON based phosphors (such as $(Si,Al)_3(O,N)_4$:Eu) and α-SiAlON based phosphors (such as $Ca(Si,Al)_{12}(O,N)_{16}$:Eu), nitride based phosphors such as LSN based phosphors (such as $(La,Y)_3Si_6N_{11}$:Ce), BSESN based phosphors (such as $(Ba,Sr)_2Si_5N_8$:Eu), SLA based phosphors (such as $SrLiAl_3N_4$:Eu), CASN based phosphors (such as $CaAlSiN_3$:Eu), and SCASN based phosphors (such as $(Sr,Ca)AlSiN_3$:Eu), fluoride based phosphors such as KSF based phosphors (such as $K_2SiF_6$:Mn), KSAF based phosphors (such as $K_2(Si_{1-x}Al_x)F_{6-x}$:Mn, where x satisfies 0<x<1), and MGF based phosphors (such as $3.5MgO·0.5MgF_2·GeO_2$:Mn), quantum dots having the perovskite structure (such as $(Cs,FA,MA)(Pb,Sn)(F,Cl,Br,I)_3$, where FA and MA respectively represent formamidinium and methylammonium), group II-VI quantum dots (such as CdSe), group III-V quantum dots (such as InP), and quantum dots having the chalcopyrite structure (such as $(Ag,Cu)(In,Ga)(S,Se)_2$).

The first resin 70 protects the wires 60 connecting the second wiring board 10 to the first wiring board 20. The first resin 70 has the shape of a rectangular frame lying along the outer edges of the first wiring board 20 in a plan view. The first resin 70 covers a portion of the upper surface of the second wiring board 10 and a portion of the upper surface of the first wiring board 20. The wires 60 are disposed inside the first resin 70. That is, the first resin 70 covers the second terminals 12 of the second wiring board 10, the wires 60, and the first terminals 22 of the first wiring board 20. In one example, the height from the upper surface of the first wiring board 20 to the top of the first resin 70 is in a range of 200 μm to 500 μm. The top of the first resin 70 here refers to the highest position of the first resin in a cross section passing through the emission surface 38.

The first resin 70 may have light-transmissive properties or light-shielding properties. In particular, the first resin 70 preferably has light-shielding properties, more preferably light-reflective properties. With this structure, for example, even when external light such as sunlight is condensed near the light-emitting module 1 through an optical system, deterioration or burning of the first resin 70 due to absorption of external light is suppressed, which allows a reliable light-emitting module 1 to be provided. For example, the first resin 70 preferably has a white or whitish color that less easily absorbs external light. The first resin 70 contains at least a base material constituted of a light-transmissive resin and preferably contains a light-reflective substance in the base material. A material similar to that of the base material of the second resin 40 described above can be used as the base material of the first resin 70. A material similar to that of the light-reflective substance in the second resin 40 described above can be used as the light-reflective substance of the first resin 70. The concentration of the light-reflective substance in the first resin 70 is preferably 15 mass % or more and 30 mass % or less, such as about 23 mass %, from the viewpoint of reduction of the light absorptance and the viewpoint of the fluidity of the resin. In an example, the base material is a dimethyl silicone resin, and the light-reflective substance is aluminum oxide.

The first resin 70 is preferably light-reflective to reduce absorption of external light as described above, but the surface is preferably less glossy. If the surface is glossy, a larger portion of light emitted from the emission surface 38 is likely to be reflected to generate stray light (that is, unnecessary reflection or scattering of light for the optical system) easily. In order to reduce the surface gloss of the first resin 70, for example, a surface of the first resin 70 preferably has fine unevenness. For example, the fine unevenness refer to having a surface roughness Ra of the first resin of 0.10 µm or more and 3.0 µm or less. For example, such a surface shape can be formed by curing before the light-reflective substance contained in the resin of the base material sediment in the resin. Alternatively, the first resin 70 may contain hollow particles that easily float in the resin as a filler for adjusting the surface shape. Examples of the hollow particles include hollow glass, hollow silica, porous silica, fly ash balloons, Shirasu balloons, and hollow polymer particles. The hollow particles are preferably hollow silica or hollow glass in view of resistance to heat, light, and the like. The first resin may also contain a light-absorbing substance as a filler for adjusting the light-reflective properties. Examples of the light-absorbing substance include graphite and black pigments such as carbon black.

When necessary, the second resin 40, the first light-transmissive layer 50, and the first resin 70 may each contain a colorant, a light-diffusing material, a filler for adjusting the viscosity, and the like and may have different external colors.

The first resin 70 includes an outer resin frame 71 and a protective resin 73 as shown in FIG. 5. The outer resin frame 71 is disposed on the second wiring board 10. The protective resin 73 is disposed on the second wiring board 10 and on the first wiring board 20, and is located inward of the outer resin frame 71. The wires 60 are disposed inside the protective resin 73. The protective resin 73 thus protects the wires 60.

The region of the upper surface of the first light-transmissive layer 50 surrounded by the first resin 70 serves as the emission surface 38 of the light-emitting module 1. In other words, the first resin 70 surrounds the emission surface 38. In the emission surface 38, the light-emitting elements 30 and the second resin 40 are disposed under the first light-transmissive layer 50. Light emitted from the light-emitting elements 30 is reflected at the second resin 40, enters the first light-transmissive layer 50, and is then emitted from the emission surface 38. In FIG. 5, the plurality of light-emitting elements 30 and the second resin 40 are collectively illustrated as a single layer.

The spacer 80 is disposed on the first light-transmissive layer 50 as shown in FIG. 5 to FIG. 8. The spacer 80 is a member for allowing the second light-transmissive layer 90 described below to be spaced apart from the first light-transmissive layer 50 when the second light-transmissive layer 90 is disposed on the first light-transmissive layer 50. The lower surface of the spacer 80 is in contact with the upper surface of the first light-transmissive layer 50. The spacer 80 has a frame shape surrounding the light-emitting elements 30 in a plan view. The spacer 80 does not overlap with at least one light-emitting element 30 among the plurality of light-emitting elements 30 in a plan view. The spacer 80 overlaps with none of the light-emitting elements 30 in the present embodiment. That is, the spacer 80 surrounds the emission surface 38 in a plan view. For example, the spacer 80 contains a resin and is made of, for example, a silicone resin.

The second light-transmissive layer 90 is disposed on the spacer 80. For example, the second light-transmissive layer 90 has a rectangular-plate shape. An upper surface 91 and a lower surface 92 of the second light-transmissive layer 90 are parallel to each other. The second light-transmissive layer 90 is spaced apart from the first light-transmissive layer 50 with the spacer 80 therebetween. The air layer 100 is therefore present between the first light-transmissive layer 50 and the second light-transmissive layer 90. The air layer 100 is located inward of the spacer 80 in a plan view. That is, the air layer 100 is surrounded by the first light-transmissive layer 50, the spacer 80, and the second light-transmissive layer 90. The air layer 100 may be hermetically sealed by the first light-transmissive layer 50, the spacer 80, and the second light-transmissive layer 90 or may communicate with the outside of the light-emitting module 1. When allowing the air layer 100 to communicate with the outside, for example, the communication can be achieved by providing a communication path such as a groove in the spacer 80 and/or the lower surface 92 of the second light-transmissive layer 90.

The second light-transmissive layer 90 is light-transmissive. The second light-transmissive layer 90 is disposed on the first light-transmissive layer 50 with the spacer 80 therebetween. In other words, the second light-transmissive layer 90 is disposed on the first light-transmissive layer 50 with the air layer 100 therebetween. Through the air layer 100, light emitted from the first light-transmissive layer 50 enters the second light-transmissive layer 90. For the second light-transmissive layer 90, a material having a higher refractive index than the air is therefore preferably used. This allows for condensing light emitted from the light-emitting module 1 toward the optical system. Examples of the material of the second light-transmissive layer 90 include glass and a resin. Among these materials, a glass plate is preferably used for the second light-transmissive layer 90. Examples of the glass include borosilicate glass and quartz glass. When the light-emitting module 1 includes a glass plate as the second light-transmissive layer 90, deterioration of the second light-transmissive layer 90 due to light, heat, and the like emitted from the light-emitting elements 30 can be reduced. Also, when the light-emitting module 1 includes the second light-transmissive layer 90, the emission surface 38 can be protected against adhesion of dust and the like.

The upper end of the first resin 70 is located at substantially the same height as the upper surface 91 of the second light-transmissive layer 90 in the Z direction as shown in FIG. 5. The upper surface of the first resin 70 and the upper surface of the second light-transmissive layer 90 therefore form a substantially continuous surface. In one example, the thickness of the second light-transmissive layer 90 is 200 µm or more and 1 mm or less, and the thickness of the spacer 80 is 100 µm or more and 200 µm or less.

The second light-transmissive layer 90 is disposed at a location inward of the frame-shaped first resin 70 in a plan view as shown in FIG. 6. The outer edges of the spacer 80 coincide with the outer edges of the second light-transmissive layer 90 in a plan view. In one example, a lateral surface of the spacer 80 and a lateral surface of the second light-transmissive layer 90 constitute a continuous flat surface, which is parallel to the Z direction. The lateral surfaces of the spacer 80 and the lateral surfaces of the second light-transmissive layer 90 are in contact with the protective resin 73 of the first resin 70. The protective resin 73 is disposed between the outer resin frame 71 and the spacer 80 and second light-transmissive layer 90 and is held by the outer resin frame 71 and the spacer 80 and second light-transmissive layer 90. That is, the lateral surfaces of the second light-transmissive layer 90 and the lateral surfaces of the spacer 80 can function as an inner frame (that is, a member holding the protective resin 73) corresponding to the outer resin frame 71.

In the present embodiment, a region of the second light-transmissive layer 90 corresponding to a region inward of the spacer 80 overlaps with the air layer 100, the first light-transmissive layer 50, and the light-emitting elements 30 in a plan view. That is, the second light-transmissive layer 90 faces the emission surface 38 with the air layer 100 therebetween. The region of the second light-transmissive layer 90 overlapping with the spacer 80 overlaps with the first light-transmissive layer 50 but does not overlap with the air layer 100 or the light-emitting elements 30 in a plan view. The first light-transmissive layer 50 is in contact with the first wiring board 20 and the spacer 80 on the periphery of the emission surface 38. The light-emitting elements 30 are not disposed between the first wiring board 20 and the spacer 80 in the present embodiment, but light-emitting elements not constituting the emission surface 38 and electronic components such as light receiving elements may be disposed.

Subsequently, an example of a method of manufacturing the spacer 80 and the second light-transmissive layer 90 in the present embodiment is described.

FIG. 9A to FIG. 9E schematically show the example of the method of manufacturing the spacer 80 and the second light-transmissive layer 90 in the present embodiment.

Figure 9A:
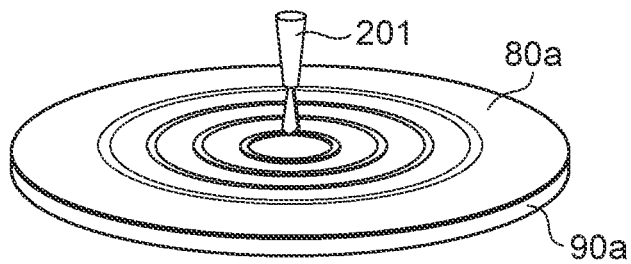
FIG. 9A schematically shows an example of a method of manufacturing the spacer and the second light-transmissive layer in the first embodiment.

First, a disc-shaped glass substrate 90a is provided as shown in FIG. 9A. A resist is then discharged on the glass substrate 90a from a nozzle 201 as a liquid resin material while rotating the glass substrate 90a. The liquid resin material thus spreads on the upper surface of the glass substrate 90a. A resin film 80a is thus formed on the glass substrate 90a.

Figure 9B:
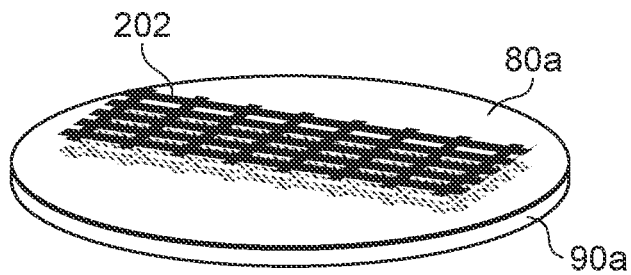
FIG. 9B schematically shows the example of the method of manufacturing the spacer and the second light-transmissive layer in the first embodiment.

Subsequently, the resin film 80a is exposed to light through a grid-like mask 202 as shown in FIG. 9B.

Figure 9C:
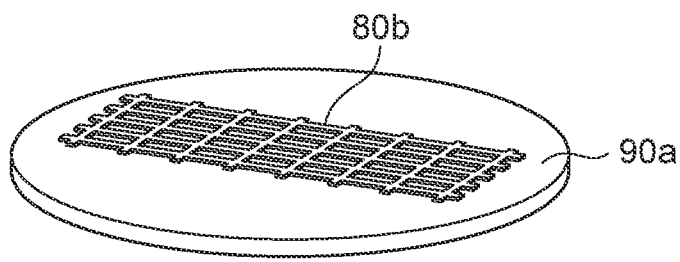
FIG. 9C schematically shows the example of the method of manufacturing the spacer and the second light-transmissive layer in the first embodiment.

Subsequently, the resin film 80a is developed as shown in FIG. 9C. The resin film 80a is thus selectively removed to form a grid-like resin frame 80b.

Figure 9D:
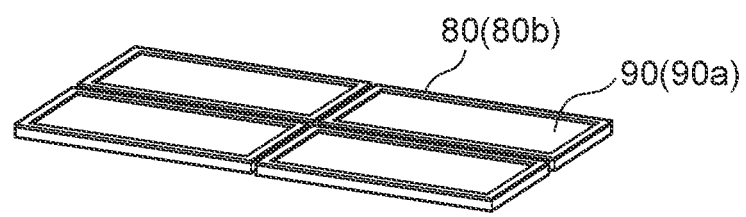
FIG. 9D schematically shows the example of the method of manufacturing the spacer and the second light-transmissive layer in the first embodiment.
Figure 9E:
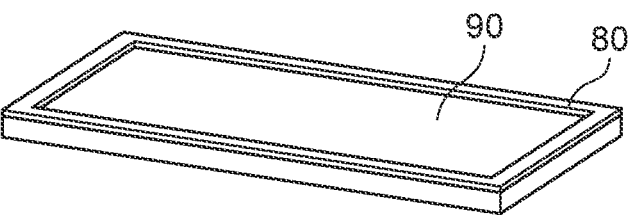
FIG. 9E schematically shows the example of the method of manufacturing the spacer and the second light-transmissive layer in the first embodiment.

Subsequently, the resin frame 80b and the glass substrate 90a are cut along the resin frame 80b as shown in FIG. 9D. Rectangular plate-shaped second light-transmissive layers 90 are thus singulated from the glass substrate 90a, and frame-shaped spacers 80 are singulated from the resin frame 80b as shown in FIG. 9E. The spacer 80 and the second light-transmissive layer 90 are thus produced.

Subsequently, another example of the method of manufacturing the spacer 80 and the second light-transmissive layer 90 in the present embodiment is described.

Figure 10:
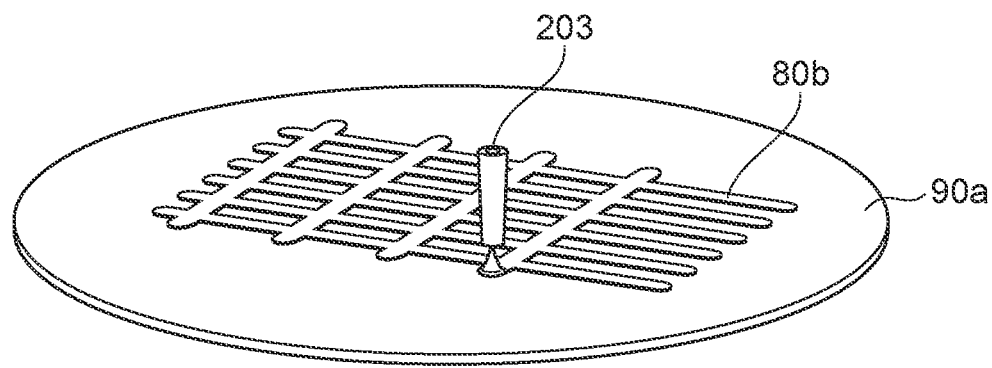
FIG. 10 schematically shows another example of the method of manufacturing the spacer and the second light-transmissive layer in the first embodiment.

FIG. 10 schematically shows the other example of the method of manufacturing the spacer 80 and the second light-transmissive layer 90 in the present embodiment.

The liquid resin material is discharged from a nozzle 203 while moving the nozzle 203 relative to the glass substrate 90a to arrange the resin material on the glass substrate 90a in the form of a grid as shown in FIG. 10. Subsequently, the resin material is solidified. The grid-like resin frame 80b is thus formed on the glass substrate 90a. The manufacturing method after this step is the same as the manufacturing method described above as one example. That is, the resin frame 80b and the glass substrate 90a are singulated as shown in FIG. 9D and FIG. 9E.

A method of manufacturing the light-emitting module 1 according to the present embodiment will be described below.

A first wiring board 20 is provided, on which a plurality of light-emitting elements 30 are mounted and on which the second resin 40 is disposed between the light-emitting elements 30 as shown in FIG. 1 to FIG. 6.

Subsequently, the first wiring board 20 is disposed on the second wiring board 10 with the bonding member 15 therebetween.

Subsequently, each of the second terminals 12 of the second wiring board 10 is connected to a corresponding one of the first terminals 22 of the first wiring board 20 using a corresponding one of the wires 60.

Subsequently, the first light-transmissive layer 50 disposed to cover the light-emitting elements 30 and the second resin 40.

Subsequently, a structure body constituted of the spacer 80 and the second light-transmissive layer 90, which is produced, for example, by the above method, is arranged on the first light-transmissive layer 50. At this time, the structure body is preferably arranged such that the spacer 80 is brought into contact with the uncured first light-transmissive layer 50. In this manner, the spacer 80 can be bonded to the first wiring board 20 using the first light-transmissive layer 50 as an adhesive.

Subsequently, the outer resin frame 71 is formed on the second wiring board 10.

Subsequently, a liquid resin material is poured into the gap between the outer resin frame 71 and the structure body and cured to provide the protective resin 73.

The light-emitting module 1 is thus obtained.

Subsequently, the operation of the light-emitting module 1 according to the present embodiment will be described.

When electricity is supplied to the light-emitting elements 30 through the second wiring board 10, the wires 60, and the first wiring board 20, the light-emitting elements 30 emit light. For example, the light-emitting elements 30 emit blue light. When the first light-transmissive layer 50 contains a phosphor, the phosphor absorbs blue light emitted from the light-emitting elements 30 and emits, for example, yellow light. Accordingly, for example, white light as light having a mixed color of blue light and yellow light is emitted from the first light-transmissive layer 50 into the air layer 100.

Light emitted from the first light-transmissive layer 50 enters the second light-transmissive layer 90 through the air layer 100. At this time, light obliquely incident on the lower surface 92 of the second light-transmissive layer 90 is refracted at the lower surface 92, and the direction of travel becomes close to perpendicular to the lower surface 92 because the refractive index of glass constituting the second light-transmissive layer 90 is higher than the refractive index of the air layer 100. This light is emitted from the upper surface 91 of the second light-transmissive layer 90 to the outside of the light-emitting module 1. As described above, with the air layer 100 being present between the first light-transmissive layer 50 and the second light-transmissive layer 90, light emitted from the light-emitting module 1 can be easily condensed in front (Z direction) of the light-emitting module 1. Accordingly, the luminance of the light-emitting module 1 is enhanced.

Subsequently, the effects of the present embodiment are described.

As described above, the light-emitting module 1 according to the present embodiment includes the second light-transmissive layer 90, and the air layer 100 is present between the first light-transmissive layer 50 and the second light-transmissive layer 90, so that the luminance can be improved.

Further, in the present embodiment, the second light-transmissive layer 90 faces the first light-transmissive layer 50 with the spacer 80 therebetween, and the distance between the first light-transmissive layer 50 and the second light-transmissive layer 90 can be uniform. This structure allows for stable enhancement of the luminance irrespective of the light-emitting elements 30 that emit light.

Furthermore, in the present embodiment, the second light-transmissive layer 90 covers the first light-transmissive layer 50 and the light-emitting elements 30, and the first light-transmissive layer 50 and the light-emitting elements 30 can be protected against dust, water, and the like. Even if foreign matter such as dust adheres to the upper surface 91 of the second light-transmissive layer 90, the foreign matter is apart from the emission surface 38, which is the focal point of the optical system, in the Z direction.

This allows for reducing the influence on a projected image that has passed through the optical system.

Furthermore, in the present embodiment, the lateral surfaces of the first resin 70 are kept substantially perpendicular by the spacer 80 and the second light-transmissive layer 90, so that light emitted from the first light-transmissive layer 50 and reflected at the lateral surfaces of the first resin 70 is less easily reflected upward. This structure inhibits light reflected at the lateral surfaces of the first resin 70 from entering an external optical system, which allows for reduction of stray light.

Second Embodiment

Figure 11:
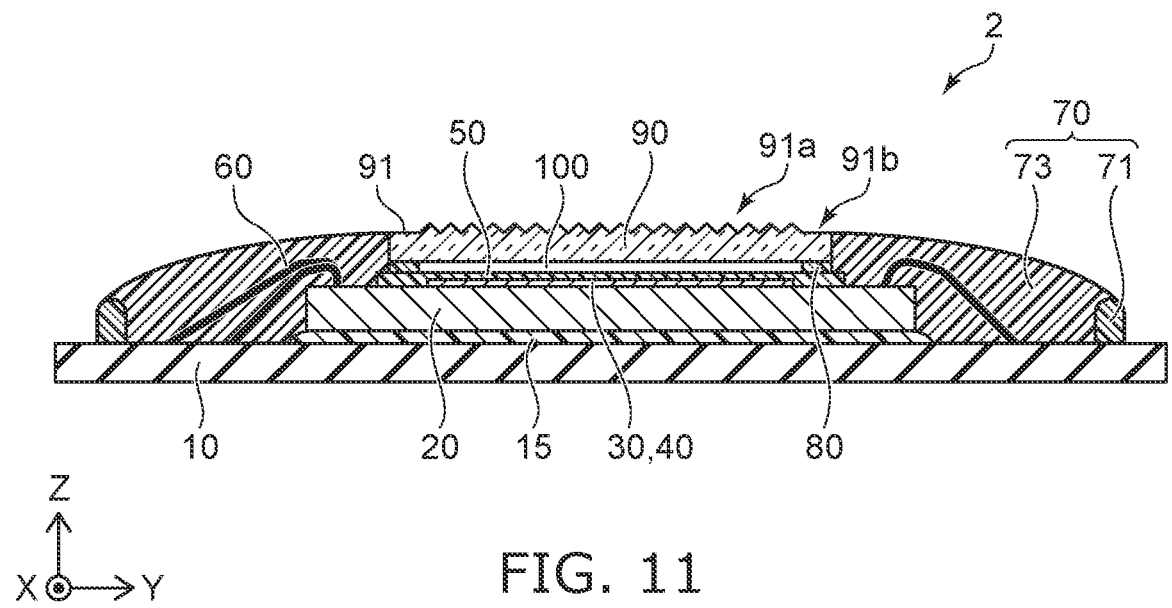
FIG. 11 is a schematic cross-sectional view of a light-emitting module according to a second embodiment.

FIG. 11 is a schematic cross-sectional view of a light-emitting module according to the present embodiment.

Figure 12:
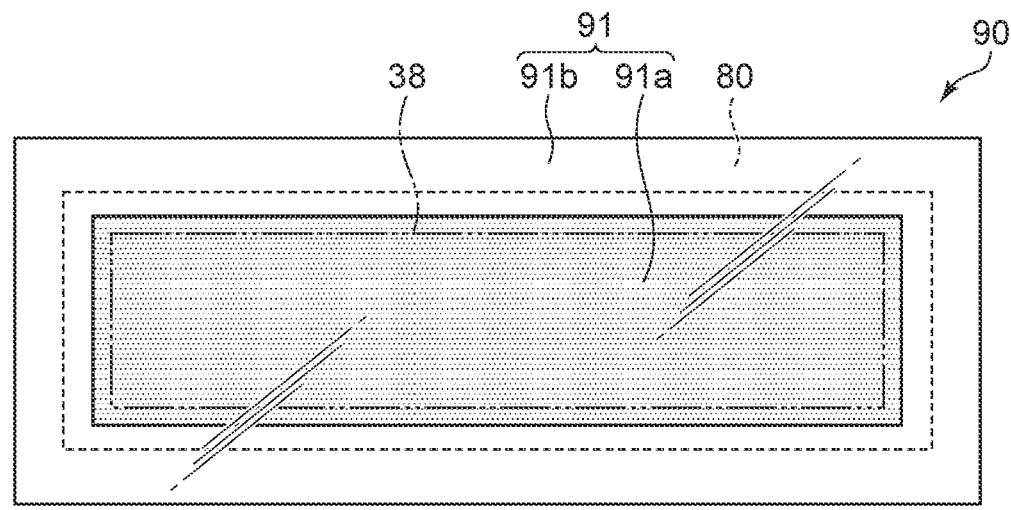
FIG. 12 is a schematic top view of the second light-transmissive layer in the second embodiment.

FIG. 12 is a schematic top view of the second light-transmissive layer 90 in the present embodiment.

In a light-emitting module 2 according to the present embodiment, the upper surface 91 of the second light-transmissive layer 90 includes a central region 91a having an uneven structure on the surface and an outer region 91b that is located around the central region 91a and has a smoother surface than the central region 91a as shown in FIG. 11 and FIG. 12. The entirety of the lower surface 92 of the second light-transmissive layer 90 is smooth. The surface unevenness of the central region 91a can be formed by a known method such as blasting and etching. The surface unevenness may be a prism surface. In FIG. 11, the plurality of light-emitting elements 30 and the second resin 40 are collectively illustrated as a single layer.

In a plan view, the outer edges of the central region 91a are located inward of the outer edges of the second light-transmissive layer 90 and outward of the outer edges of the emission surface 38 in which the light-emitting elements 30 are disposed. The outer edges of the central region 91a may be located outward or inward of the inner edges of the spacer 80 in a plan view.

In the present embodiment, the central region 91a of the upper surface 91 of the second light-transmissive layer 90 has the uneven surface structure, which allows the light extraction efficiency from the second light-transmissive layer 90 to be increased. On the other hand, the outer region 91b of the upper surface 91 of the second light-transmissive layer 90 does not have the uneven surface structure, which allows for reducing penetration of the first resin 70 into the central region 91a along the outer region 91b. The structure, the manufacturing method, the operation, and the effect in the present embodiment are the same as the first embodiment except for the above points.

Third Embodiment

Figure 13:
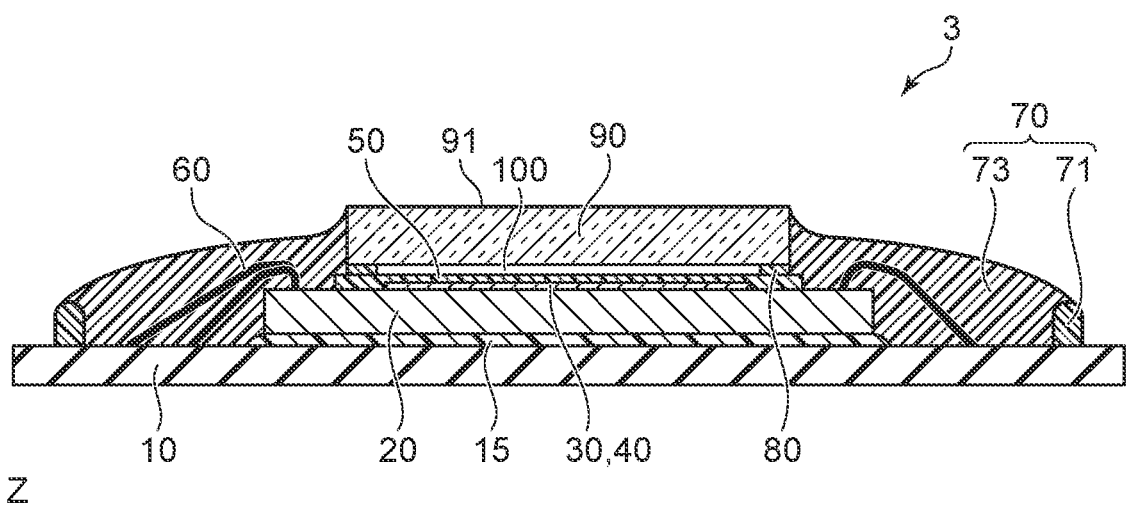
FIG. 13 is a schematic cross-sectional view of a light-emitting module according to a third embodiment.

FIG. 13 is a schematic cross-sectional view of a light-emitting module according to the present embodiment.

In a light-emitting module 3 according to the present embodiment, the second light-transmissive layer 90 has a larger thickness than in the light-emitting module 1 of the first embodiment as shown in FIG. 13. The second light-transmissive layer 90 is disposed on the first light-transmissive layer 50 such that the upper portion thereof projects upward from the first resin 70. In FIG. 13, the plurality of light-emitting elements 30 and the second resin 40 are collectively illustrated as a single layer.

In the present embodiment, portions of the lateral surfaces of the second light-transmissive layer 90 connected to the upper surface 91 in the thickness direction may be exposed from the first resin 70, or an entirety of the lateral surfaces of the second light-transmissive layer 90 connected to the upper surface 91 in the thickness direction may be covered with the first resin 70. Among these, it is preferable that substantially the entirety of the lateral surfaces of the second light-transmissive layer 90 in the thickness direction is covered with the first resin 70. The first resin 70 covering substantially the entirety of the lateral surfaces of the second light-transmissive layer 90 is formed by creeping of the liquid resin material disposed between the outer resin frame 71 and the structure body onto the lateral surfaces of the second light-transmissive layer 90.

In the present embodiment, by increasing a thickness of the second light-transmissive layer 90, the effect of protecting the light-emitting elements 30 and the effect of spacing foreign matter away from the light-emitting elements 30 when the foreign matter has adhered to the upper surface 91 of the second light-transmissive layer 90 can be improved. The structure, the manufacturing method, the operation, and the effect in the present embodiment are the same as the first embodiment except for the above points.

Each embodiment described above is an example that gives a concrete form to the present invention, and the present invention is not limited to these embodiments. For example, modifications obtained by adding or removing some components or steps to or from each of the embodiments described above are also encompassed by the present invention. In addition, two or more of the above embodiments can be combined with each other.

The embodiments include the following configurations.

(Aspect 1)

A light-emitting module including: a first wiring board; a plurality of light-emitting elements disposed on or above the first wiring board; a first light-transmissive layer covering the plurality of light-emitting elements; a spacer disposed on or above the first light-transmissive layer; and a second light-transmissive layer disposed on or above the spacer. An air layer is present between the first light-transmissive layer and the second light-transmissive layer. The spacer does not overlap with at least one light-emitting element among the plurality of light-emitting elements in a plan view.

(Aspect 2)

In the light-emitting module according to Aspect 1, the spacer has a frame shape surrounding the plurality of light-emitting elements in a plan view.

(Aspect 3)

In the light-emitting module according to Aspect 1 or 2, an outer edge of the spacer coincides with an outer edge of the second light-transmissive layer in a plan view.

(Aspect 4)

In the light-emitting module according to any one of Aspects 1 to 3, the spacer is in contact with the first light-transmissive layer.

(Aspect 5)

In the light-emitting module according to any one of Aspects 1 to 4, the spacer contains a resin, and the second light-transmissive layer contains glass.

(Aspect 6)

The light-emitting module according to any one of Aspects 1 to 5, further includes a first resin covering at least a portion of a lateral surface of the second light-transmissive layer and a lateral surface of the spacer.

(Aspect 7)

The light-emitting module according to Aspect 6, further includes a second wiring board, the first wiring board being disposed on or above the second wiring board, and the first resin covering a portion of an upper surface of the first wiring board and a portion of an upper surface of the second wiring board.

(Aspect 8)

The light-emitting module according to Aspect 7, further includes a wire disposed inside the first resin to connect the first wiring board to the second wiring board.

(Aspect 9)

In the light-emitting module according to any one of Aspects 6 to 8, an upper end of the first resin is located at a same height as or below an upper surface of the second light-transmissive layer.

(Aspect 10)

In the light-emitting module according to any one of Aspects 1 to 9, the first light-transmissive layer is in contact with the first wiring board.

For example, the embodiments of the present invention can be used for light sources for headlights for vehicles, displays, or the like.

What is claimed is:

1. A light-emitting module comprising:
   a first wiring board;
   a plurality of light-emitting elements disposed on or above the first wiring board;
   a first light-transmissive layer covering the plurality of light-emitting elements, the first light-transmissive layer contacting the plurality of light-emitting elements;
   a spacer disposed on or above the first light-transmissive layer; and
   a second light-transmissive layer disposed on or above the spacer, wherein
   an air layer is present between the first light-transmissive layer and the second light-transmissive layer, and
   the spacer does not overlap with at least one of the plurality of light-emitting elements in a plan view.

2. The light-emitting module according to claim 1, wherein
   the spacer has a frame shape surrounding the plurality of light-emitting elements in the plan view.

3. The light-emitting module according to claim 1, wherein
   an outer edge of the spacer coincides with an outer edge of the second light-transmissive layer in the plan view.

4. The light-emitting module according to claim 1, wherein
   the spacer is in contact with the first light-transmissive layer.

5. The light-emitting module according to claim 1, wherein
   the spacer contains a resin.

6. The light-emitting module according to claim 1, wherein
   the second light-transmissive layer contains glass.

7. The light-emitting module according to claim 1, wherein
   the first light-transmissive layer contains phosphor.

8. The light-emitting module according to claim 1, wherein
   the first light-transmissive layer is in contact with the first wiring board.

9. The light-emitting module according to claim 1, wherein
   the second light-transmissive layer has an uneven structure on an upper surface.

10. The light-emitting module according to claim 9, wherein
    the uneven structure is a prism surface.

11. The light-emitting module according to claim 1, wherein
    the first wiring board is a silicon substrate containing an integrated circuit.

12. The light-emitting module according to claim 1, wherein
    the spacer overlaps with none of the plurality of light-emitting elements in a plan view.

13. The light-emitting module according to claim 1, further comprising
    a first resin covering at least a portion of a lateral surface of the second light-transmissive layer and a lateral surface of the spacer, wherein
    an upper end of the first resin is located at a same height as or below an upper surface of the second light-transmissive layer, and
    an upper surface of the first resin is displaced downward as it moves away from the second light-transmissive layer.

14. A light-emitting module comprising:
    a first wiring board;
    a plurality of light-emitting elements disposed on or above the first wiring board;
    a first light-transmissive layer covering the plurality of light-emitting elements, the first light-transmissive layer contacting the plurality of light-emitting elements;
    a spacer disposed on or above the first light-transmissive layer;
    a second light-transmissive layer disposed on or above the spacer; and
    a first resin covering at least a portion of a lateral surface of the second light-transmissive layer and a lateral surface of the spacer, wherein
    an air layer is present between the first light-transmissive layer and the second light-transmissive layer, and
    the spacer does not overlap with at least one of the plurality of light-emitting elements in a plan view.

15. The light-emitting module according to claim 14, wherein
    the first resin contains light-reflective substance.

16. The light-emitting module according to claim 14, further comprising
    a second wiring board, wherein the first wiring board is disposed on or above the second wiring board, and the first resin covers a portion of an upper surface of the first wiring board and a portion of an upper surface of the second wiring board.

17. The light-emitting module according to claim 16, further comprising a wire disposed inside the first resin to connect the first wiring board to the second wiring board.

18. The light-emitting module according to claim 14, wherein an upper end of the first resin is located at a same height as or below an upper surface of the second light-transmissive layer.

19. The light-emitting module according to claim 18, wherein an upper surface of the first resin is displaced downward as it moves away from the second light-transmissive layer.

* * * * *